US009842991B2

(12) United States Patent
Nelson et al.

(10) Patent No.: US 9,842,991 B2
(45) Date of Patent: Dec. 12, 2017

(54) MEMORY CELL WITH REDUNDANT CARBON NANOTUBE

(71) Applicant: Honeywell International Inc., Morristown, NJ (US)

(72) Inventors: David K. Nelson, Medicine Lake, MN (US); Keith W. Golke, Minneapolis, MN (US)

(73) Assignee: Honeywell International Inc., Morris Plains, NJ (US)

( * ) Notice: Subject to any disclaimer, the term of this patent is extended or adjusted under 35 U.S.C. 154(b) by 733 days.

(21) Appl. No.: 13/846,677

(22) Filed: Mar. 18, 2013

(65) Prior Publication Data

US 2014/0264251 A1 Sep. 18, 2014

Related U.S. Application Data

(60) Provisional application No. 61/849,825, filed on Mar. 15, 2013.

(51) Int. Cl.
*G11C 16/04* (2006.01)
*G11C 16/06* (2006.01)
(Continued)

(52) U.S. Cl.
CPC ........ *H01L 45/149* (2013.01); *G11C 13/0002* (2013.01); *G11C 13/025* (2013.01);
(Continued)

(58) Field of Classification Search
CPC ....... H01L 2924/13091; H01L 51/0048; H01L 51/52; H01L 2224/05552; H01L 31/035281; H01L 45/04; H01L 45/1226; H01L 45/1233; H01L 45/149; H01L 45/1608; H01L 45/1675; H01L 29/861; H01L 29/872; H01L 27/2409; H01L 27/2481; H01L 27/249; H01L 29/1606; G11C 13/0002; G11C 13/003; G11C 13/025; G11C 23/00
(Continued)

(56) References Cited

U.S. PATENT DOCUMENTS 6,839,826 B2 1/2005 Cernea
7,113,426 B2 9/2006 Rueckes et al.
(Continued)

FOREIGN PATENT DOCUMENTS

EP 2309515 A1 4/2011
EP 2570385 A2 3/2013

OTHER PUBLICATIONS

Nicolo Chiodarelli, Measuring the electrical resistivity and contact resistance of vertical carbon nanotube bundles for application as interconnects, Jan. 17, 2011, http://stacks.iop.org/Nano/22/085302, Nanotechnology 22 (2011) 085302 (7pp).*
(Continued)

*Primary Examiner* — Mary Wilczewski
*Assistant Examiner* — Tsz Chiu
(74) *Attorney, Agent, or Firm* — Shumaker & Sieffert, P.A.

(57) ABSTRACT

A configuration for a carbon nanotube (CNT) based memory device can include multiple CNT elements in order to increase memory cell yield by reducing the times when a memory cell gets stuck at a high state or a low state.

9 Claims, 3 Drawing Sheets

(51) Int. Cl.
| | |
|---|---|
| G11C 16/28 | (2006.01) |
| G11C 7/10 | (2006.01) |
| G11C 8/00 | (2006.01) |
| H01L 45/00 | (2006.01) |
| G11C 13/02 | (2006.01) |
| H01L 27/24 | (2006.01) |
| G11C 23/00 | (2006.01) |
| G11C 29/00 | (2006.01) |
| G11C 13/00 | (2006.01) |

(52) U.S. Cl.
CPC ............ *G11C 23/00* (2013.01); *G11C 29/814* (2013.01); *H01L 27/2436* (2013.01)

(58) Field of Classification Search
USPC ........................ 365/189.05, 230.08; 977/943
See application file for complete search history.

(56) References Cited

U.S. PATENT DOCUMENTS

| | | |
|---|---|---|
| 7,211,854 B2 | 5/2007 | Berlin et al. |
| 7,379,326 B2 | 5/2008 | Ushida et al. |
| 7,479,654 B2 | 1/2009 | Bertin et al. |
| 7,482,653 B2 | 1/2009 | Sandhu et al. |
| 7,549,012 B2 | 6/2009 | Cernea |
| 7,598,544 B2 | 10/2009 | Bertin et al. |
| 7,671,398 B2 | 3/2010 | Tran |
| 7,675,768 B1 | 3/2010 | Kim |
| 7,723,180 B2 | 5/2010 | Chen et al. |
| 7,742,328 B2 | 6/2010 | Chen et al. |
| 7,839,710 B2 | 11/2010 | Kam et al. |
| 7,851,292 B2 | 12/2010 | Sandhu et al. |
| 7,855,403 B2 | 12/2010 | Bertin et al. |
| 7,864,560 B2 | 1/2011 | Tran |
| 7,911,831 B2 | 3/2011 | Rueckes et al. |
| 7,933,160 B2 | 4/2011 | Kim |
| 7,943,464 B2 | 5/2011 | Berg et al. |
| 7,948,054 B2 | 5/2011 | Bertin et al. |
| 7,961,494 B2 | 6/2011 | Scheuerlein |
| 2002/0006054 A1* | 1/2002 | Shukuri ................ B82Y 10/00 365/145 |
| 2006/0250856 A1* | 11/2006 | Bertin et al. ............. 365/189.01 |
| 2008/0012047 A1* | 1/2008 | Bertin et al. .................. 257/213 |
| 2008/0079027 A1* | 4/2008 | Bertin .................... B82Y 10/00 257/209 |
| 2008/0142850 A1 | 6/2008 | Bertin et al. |
| 2008/0158936 A1 | 7/2008 | Bertin et al. |
| 2008/0159042 A1 | 7/2008 | Bertin et al. |
| 2009/0303801 A1* | 12/2009 | Kim ........................ 365/189.05 |
| 2009/0323392 A1 | 12/2009 | Fasoli et al. |
| 2011/0044091 A1 | 2/2011 | Bertin et al. |
| 2011/0049463 A1 | 3/2011 | Yamamoto et al. |
| 2011/0110141 A1 | 5/2011 | Tran |
| 2011/0170333 A1 | 7/2011 | Kubo et al. |

OTHER PUBLICATIONS

"Lockheed Martin Tests Carbon Nanotube-Based Memory Devices Developed Jointly With Nantero," 2009, retrieved from http://ir.hhvc.com/releasedetail.cfm?ReleaseID=425172 on Jan. 13, 2014, 1 pp.

Smith, R., "Nanotechnology: From the Lab to Devices—NRAM," Lockheed Martin Nanosystems, Feb. 2008, 27 pp.

Maguire, J., "Highlights," Lockheed Martin Space Systems Company, Spring 2010, 32 pp.

"NANTERO—The principles of operation of NRAM," animated presentation presented by NANOPOLIS, 2004, webpage can be retrieved at: http://www.nantero.com/nram.html, accessed on Jan. 13, 2014.

Rinkio et al., "High-Speed Memory from Carbon Nanotube Field-Effect Transistors with High-K Gate Dielectric", Feb. 2009, ACS Publications, Nano Letters, 2 pp.

Hollingsworth et al., "Carbon Nanotube Based Nonvolatile Memory", Applied Physics Letters 87, Published online Dec. 2, 2005, 3 pages.

"Safety First," MicroPilot, downloadable from http://www.micropilot.com/product-tour-uav-horizon-01.htm, downloaded on Jan. 25, 2013, 1 pp.

U.S. Appl. No. 14/068,683, by Keith Golke, filed Oct. 31, 2013.
U.S. Appl. No. 13/777,592, by Keith W. Golke, filed Feb. 26, 2013.

* cited by examiner

US 9,842,991 B2

MEMORY CELL WITH REDUNDANT CARBON NANOTUBE

This application claims the benefit of U.S. Provisional Application No. 61/849,825 by Nelson et al., which is entitled, "MEMORY CELL WITH REDUNDANT CARBON NANOTUBE" and was filed on Mar. 15, 2013. U.S. Provisional Application No. 61/849,825 by Nelson et al. was converted to a provisional application from U.S. patent application Ser. No. 13/842,847, also entitled, "MEMORY CELL WITH REDUNDANT CARBON NANOTUBE" and filed on Mar. 15, 2013. The entire content of U.S. Provisional Application No. 61/849,825 by Nelson et al. is incorporated herein by reference.

STATEMENT REGARDING FEDERALLY SPONSORED RESEARCH OR DEVELOPMENT

This invention was made with Government support under Government Contract #09-C-0070 awarded by the U.S. Government. The Government has certain rights in the invention.

TECHNICAL FIELD

This disclosure relates to memory devices and, more specifically, to non-volatile memory devices that use carbon nanotubes.

BACKGROUND

Most modern electronic devices include a power source, components for storing data, components for processing data, components for receiving user input, and components for delivering user output. It is desirable for such electronic devices to have tong battery life, powerful processing capabilities, and large amounts of data storage, but at the same time, it is also desirable for electronic devices to maintain small and lightweight form factors. To meet these conflicting demands, it is desirable for the components of these devices to become smaller with better performance.

It is generally desirable for memory components, for example, to store more data in a smaller space with faster read and write operations. Current types of non-volatile memory include electro-mechanical hard drives where read/write heads read and write data from and to a series of rotating disks. Other types of non-volatile memory include solid state memories that use transistors and other devices capacitors, floating gate MOSFETs) to store data without any moving parts and with faster read and write access.

SUMMARY

This disclosure generally describes a configuration for a carbon nanotube (CNT) based memory device. The techniques may in some instances provide for more reliable device performance.

In one example, a carbon nanotube based memory device includes a first carbon nanotube (CNT) element and a second CNT element. A first terminal of the first CNT element is connected to a first terminal of the second CNT element at a first node, and a second terminal of the first CNT element is connected to a second terminal of the second CNT element at a second node to connect the first and second CNT elements in parallel.

In another example, a carbon nanotube based memory device includes a first carbon nanotube (CNT) element, a second CNT element connected in series to the first CNT element, a third CNT element, and a fourth CNT element connected in series to the third CNT element. A first terminal of the first CNT element is connected to a first terminal of the third CNT element at a first node, and a first terminal of the third CNT element is connected to a first terminal of the fourth CNT element at a second node to connect the first and second series connected CNT elements in parallel with the third and fourth series connected CNT elements.

In another example, a carbon nanotube based memory device includes an array of memory cells. The one or more of the memory cells include a first carbon nanotube (CNT) element and a second CNT element, wherein a first terminal of the first CNT element is connected to a first terminal of the second CNT element at a first node. The second terminal of the first CNT element is connected a second terminal of the second CNT element at a second node to connect the first and second CNT elements in parallel. The first and second CNT element assembly is connected in series with an access metal oxide semiconductor field effect transistor (MOSFET) wherein a drain of the access MOSFET is connected to the first terminals of the first and second CNT elements; a first bitline is connected to the source of the access MOSFET; a second bitline is connected to the second terminals of the first and second CNT elements; and the wordline is connected to the gate of the access MOSFET.

The details of one or more embodiments of the invention are set forth in the accompanying drawings and the description below. Other features, objects, and advantages of the invention will be apparent from the description and drawings, and from the claims.

DETAILED DESCRIPTION

Figure 1A:
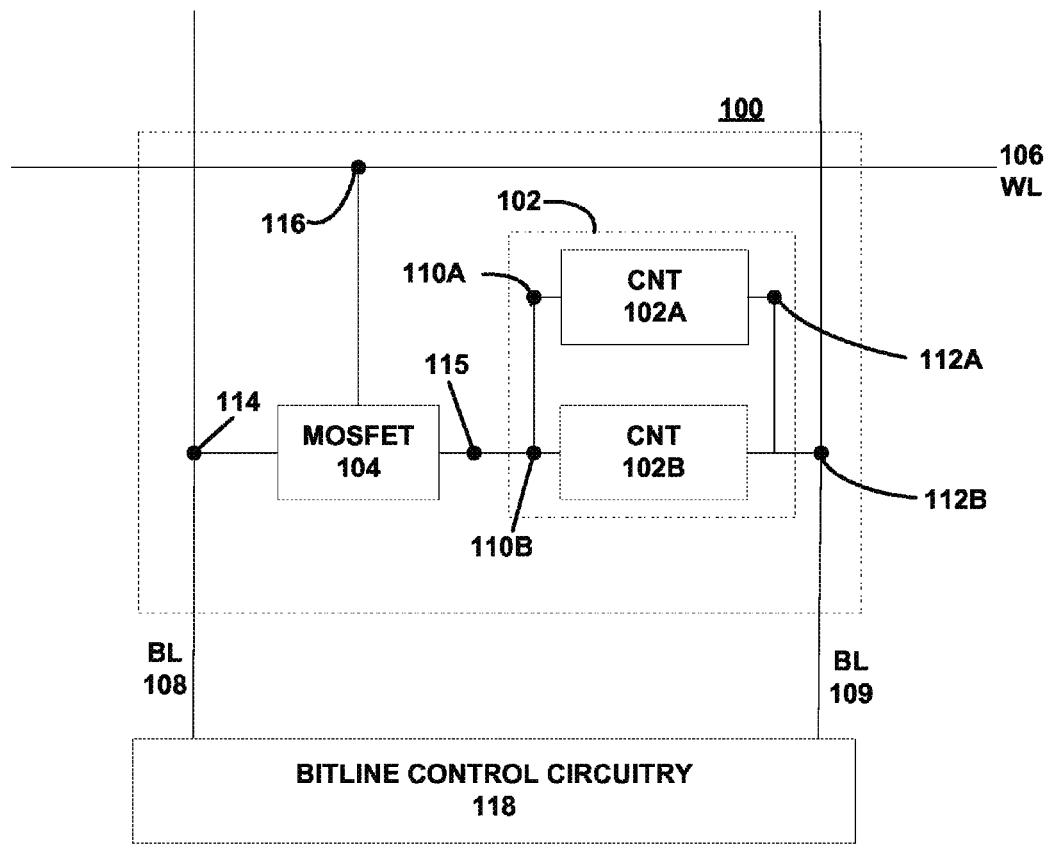
FIG. 1A shows a circuit diagram of a carbon nanotube (CNT) based memory cell implementing one CNT configuration technique of the present disclosure.

FIG. 1A is a circuit diagram of a carbon nanotube based memory cell 100 configured according to techniques of this disclosure. Memory cell 100 may form part of a larger memory device that includes, for example, tens of billions of memory cells or more. Carbon nanotube memory cell 100 includes carbon nanotube (CNT) element 102A, CNT 1029, an access metal-oxide semiconductor field effect transistor (access MOSFET) 104 that can be turned "ON" and "OFF" to control access to CNT 102, wordline (WL)106, bitline (BL) 108, and bitline (BL) 109. Access MOSFET 104 includes three terminals, terminal 114, terminal 115, and terminal 116. CNT 102A includes a first terminal 110A and a second terminal 112A. CNT 102B similarly includes a first terminal 110B and a second terminal 112B and is connected to CNT 102A in parallel, such that terminals 110A and 110B are connected at a common node, and terminals 112A and 112B are connected at a common node. At times throughout this disclosure, the combination of CNT 102A in parallel with CNT 102B will be referred to simply as CNT 102 having terminals 110 and 112. As will be described in more detail below, CNT 102 has a total resistance value that is the function of the resistance of CNT 102A and the resistance of CNT 102B.

CNT 102 terminal 110 connects to access MOSFET 104 at terminal 115, which corresponds to one of the source/drain terminals of access MOSFET 104. Bitline 109 connects to CNT 102 terminal 112. Bitline 108 connects to access MOSFET 104 at terminal 114, which corresponds to one of the other source/drain terminals of access MOSFET 104. Wordline 106 connects to access MOSFET 104 at terminal 116, which corresponds to a gate of access MOSFET 104. Bitline 109 and bitline 108 connect to bitline control circuitry 118 which controls the voltages applied to the bitlines and measures a current through CNT 102. The power source for this circuit (not shown in FIG. 1A) provides the power supply voltage. In this disclosure, the convention that the more positive of the power supply nodes is labeled $V_{DD}$ and the more negative of the power supply nodes is labeled $V_{SS}$ will be followed.

As used in this disclosure, the term node generally refers to a connection point where two or more terminals connect to one another or where one or more terminals connects to a line, such as bitline 108, bitline 109, or wordline 106. Referring to the example of FIG. 1A, terminal 110A of CNT 102A and terminal 110B of CNT 102B connect to terminal 115 of MOSFET 104 at a node, and terminal 112A of CNT 102A and terminal 112B of CNT 102B connect to bitline 109 at a node. Likewise, terminal 114 of MOSFET 104 connects to bitline 108 at a node, and terminal 116 of MOSFET 104 connects to wordline 106 at a node.

As will be described in greater detail below, in some implementations described in this disclosure access MOSFET 104 may comprise an n-channel MOSFET. If access MOSFET 104 is an n-channel MOSFET, then the gate of access MOSFET 104 corresponds to terminal 116, which connects to wordline 106. The source of access MOSFET 104 corresponds to the more negative of terminal 114 and terminal 115 during operation, and the drain of access MOSFET 104 corresponds to the more positive of terminal 114 and terminal 115 during operation. The body of access MOSFET 104 connects to either the source of MOSFET 104 or the more negative of the power supply nodes ($V_{SS}$) or can be left floating if isolated from all other MOSFET body terminals.

Memory cell 100 can be operated in a manner that stores a single bit of data (i.e. a "0" or "1"). The storage data state of memory cell 100 can be a function of the resistance value of CNT 102, which corresponds to the resistance between terminal 110 and terminal 112. The resistance value of CNT 102 can be considered programmable in the sense that it can be set to a desired value (i.e. high or low), and this desired value can be considered to represent a bit of digital data. For example, a high resistance value for CNT 102 may correspond to a digital "0," and a low resistance value for CNT 102 may correspond to a digital "1." The resistance value of CNT 102 can be changed depending on the current and voltage applied to CNT 102 across terminal 110 and terminal 112. Therefore, by controlling the magnitude and duration (i.e., pulse width time=Tpulse) of a voltage and current applied to CNT 102, the resistance value of CNT 102 can be written to the low resistance value that corresponds to a digital "1" or to the high resistance value that corresponds to a digital "0" as desired.

The observed resistance change behavior of the CNT is as follows. If CNT 102 is in a low resistance state, then applying a high voltage difference across terminal 110 and terminal 112 results in a high current flow through CNT 102. A high voltage with high current condition causes the resistance of CNT 102 to increase. The increased resistance, however, lowers the current through CNT 102, but the high voltage difference across terminal 110 and terminal 112 is maintained. A high voltage with low current condition causes the resistance to decrease, taking CNT 102 back to a low resistance state. Once the resistance is low again, the current through CNT 102 once again increases, causing the resistance of CNT 102 to once again increase. In this manner, the resistance of CNT 102 oscillates between a high resistance state and a low resistance state when a high voltage difference is continuously applied across terminal 110 and terminal 112.

The transition time between the high and low resistance states is finite. By controlling the magnitude and duration (Tpulse) of the applied voltage across terminal 110 and terminal 112, CNT 102 can be successfully written to a "0" (i.e. a high resistance value) or written to a "1" (i.e. a low resistance value). Further, CNT 102 can be successfully written to a "1" ($R_{low}$) by limiting the current the applied voltage can supply to a low level ($I_{low}$) that is insufficient to cause a $R_{high}$ to $R_{low}$ change. If initially CNT 102 is in a "0" ($R_{high}$) state, by limiting the current $V_{high}$ can provide to $I_{low}$, after CNT 102 has changed from $R_{high}$ to $R_{low}$, the $I_{low}$ limit prevents CNT 102 from changing back to an $R_{high}$ state and the Write "1" ($R_{low}$) operation is successfully completed. For purposes of explanation, this disclosure generally follows the convention that setting the resistance of CNT 102 to a high resistance (i.e. low conductivity) state is a "write 0" operation or "write low" operation, while setting the resistance of CNT 102 to a low resistance (i.e. high conductivity) state is a "write 1" or "write high" operation. Of course, these operations could also be logically reversed.

When reading CNT 102, it is generally desirable to keep the resistance state of CNT 102 unchanged. Thus, to read CNT 102, a low voltage difference, which does not change the resistance value, can be applied across terminal 110 and terminal 112 by applying a low voltage difference across bitline 108 and bitline 109. The current through CNT 102 can be measured by bitline control circuitry 118. Based on the measured current and the voltage across bitline 108 and bitline 109, the resistance of CNT 102 can be determined to be either high or low. Depending on whether the resistance of CNT 102 is high or low, it can be determined if the value of memory cell 100 is a digital "0" or digital "1." Access MOSFET 104 can be selected to have a resistance that is much less than the resistance of CNT 102, such that the resistance between terminal 114 and terminal 112 can be used as an approximation of the resistance between terminal 110 and terminal 112. As will be explained in greater detail below, the desired read condition for reading a resistance value of CNT 102 and the desired write conditions for changing a resistance value of CNT 102 can be achieved based on the voltages applied to wordline 106, bitline 108, and bitline 109.

The terms high resistance ($R_{high}$), low resistance ($R_{low}$), high voltage ($V_{high}$), low voltage ($V_{low}$) high current ($I_{high}$), and low current ($I_{low}$) are generally meant to be relative terms, where a high resistance value is greater than a low resistance value ($R_{high} > R_{low}$), a high voltage can be equal to or greater than $V_{DD}$ and is greater than a low voltage ($V_{DD} \leq V_{high} > V_{low}$), a low voltage is less than $V_{DD}$ but greater than $V_{SS}$ ($V_{DD} > V_{low} > V_{SS}$), and a high current is greater than a low current ($I_{high} > I_{low}$). The terms are not meant to imply specific resistances, voltages, or currents of any specific values.

When multiple nodes are said to have a high voltage ($V_{high}$) for a given operating condition, the voltage values for these different nodes may be the same but do not necessarily need to be the same. Similarly, when different operating conditions are defined to have a high voltage, the voltage values may not be the same as in other operating conditions. When multiple nodes are defined to have a low voltage for a given operating condition, the voltage values may not be the same on the different nodes. When different operating conditions are defined to have a low voltage, the voltage values may not be the same as in other operating conditions. $V_{DD}$ and $V_{SS}$ values can be applied to nodes by either direct connection to the $V_{DD}$ and $V_{SS}$ nodes or driven to $V_{DD}$ and $V_{SS}$ values through circuitry. A means to create Vhigh>$V_{DD}$ can be achieved, for example, by using a charge pump circuit. A means to create $V_{DD}$<Vlow>$V_{SS}$ can be achieved, for example, by using a reference voltage (Vref) generating circuit which may contain a bandgap circuit. Both the charge pump and Vref circuits are commonly known in the integrated circuit industry. As examples, in some implementations where $V_{DD}$=5V, a low voltage for reading CNT 102 may be approximately 1V while a high voltage for writing to CNT 102 may be approximately 6-8V. A high resistance value corresponding to a "0" or low state may be approximately 10-100 giga-ohms, while a low resistance value corresponding to a "1" or a high state may be approximately 10-100 kilo-ohms. An "ON" access MOSFET impedance may be approximately 1-10 kilo-ohms. These ranges of voltages and resistances, however, are merely examples, as the memory devices of the present disclosure can be configured to operate over other ranges of voltages and resistances.

In one example configuration, access MOSFET 104 is an n-channel MOSFET. In a first operating mode (operating mode 1), the value of memory cell 100 (i.e. the resistance of CNT 102) can be changed by applying a high voltage ($V_{high}$) to terminal 110 and a source voltage ($V_{SS}$) to terminal 112. $V_{SS}$ in some instances may be a ground voltage, but regardless of whether or not $V_{SS}$ is a ground voltage, $V_{SS}$ can be assumed to be a lower voltage than $V_{high}$ and $V_{low}$. The high voltage applied to terminal 110 can be achieved by applying a high voltage to terminal 114 and a high voltage to terminal 116. Applying a $V_{DD}$ or high voltage to the gate (i.e. terminal 116) of MOSFET 104 causes MOSFET 104 to turn "ON" and conduct current between its source and its drain (i.e. between terminal 114 and terminal 115) and pass the high voltage from terminal 114 to terminal 110 but with some amount of voltage drop (i.e., Vdrop) across the access MOSFET. Thus, if a high voltage is applied to terminal 114 while a high voltage is also applied to terminal 116 that is high enough to account for the Vdrop across the MOSFET, a sufficiently high voltage can be presented at terminal 110. The high voltage across terminal 110 to terminal 112 can cause the resistance of CNT 102 to oscillate, as described above. Accordingly, a write 1 operation can be achieved by removing the high voltage across CNT 102 after the high to low resistance transition time (i.e. create a low resistance, which corresponds to a "1" being stored on CNT 102) through CNT 102. A write 0 operation can be achieved by removing the high voltage across CNT 102 after the low to high resistance transition time (i.e. create a high resistance, which corresponds to a "0" being stored on CNT 102) though CNT 102. Removing the high voltage across CNT 102 can be achieved by removing the high voltage at terminal 116 to turn "OFF" the access MOSFET causing current to stop flowing from terminal 114 to terminal 110, or by altering the voltage of bitline 108 and/or bitline 109. The time duration for the CNT device to change from a low to high resistance (write "0") and from a high to low resistance (write "1") is a characteristic of the CNT device technology and design and can be determined beforehand. Thus the time duration that the high voltage is applied across CNT 102 can be designed into the wordline or bitline control circuitry that results in successful write "0" or "1" operations. Common examples of circuits that can realize these duration times are delay lines and ring oscillators driving counters.

To read the value of memory cell 100 in operating mode 1, a high voltage can be applied at terminal 116 such that current flows through MOSFET 104 from terminal 114 to terminal 110, but a low voltage can be applied to node 108, such that the voltage drop from terminal 110 to terminal 112 is low, preventing the resistance of CNT 102 from changing. Bitline control circuitry 118 can measure the current flowing through CNT 102, and based on the measured current can determine the resistance state of CNT 102. Memory cell 100 can also be put into a standby mode by applying the source voltage to all of nodes, 112, 114, and 116. In the standby mode, little or no current flows through CNT 102, preventing the resistance value of memory cell 100 stored on CNT 102 from changing.

The operating conditions of operating mode 1, can thus be summarized as follows:

| | WL106 | BL108 | BL109 | Tpulse | Icnt | CNTresult |
|---|---|---|---|---|---|---|
| Write1: | $V_{high}$ | $V_{high}$ | $V_{SS}$ | $R_{high}$ to $R_{low}$ time | limit to $I_{low}$ | $R_{low}$ |
| Write0: | $V_{high}$ | $V_{high}$ | $V_{SS}$ | $R_{low}$ to $R_{high}$ time | allow $I_{high}$ | $R_{high}$ |
| Read: | $V_{high}$ | $V_{low}$ | $V_{SS}$ | NA | NA | $R_{unchanged}$ |
| Standby: | $V_{SS}$ | $V_{SS}$ | $V_{SS}$ | NA | NA | $R_{unchanged}$ |

In an alternate, second operating mode (operating mode 2), the value of memory cell 100 (i.e. the resistance of CNT 102) can be changed by applying a source voltage ($V_{SS}$) to terminal 110 and a high voltage to terminal 112. The source voltage applied to terminal 110 can be achieved by applying the source voltage to terminal 114 and a high voltage to terminal 116. Applying a high voltage to the gate (i.e. terminal 116) of MOSFET 104 causes MOSFET 104 to turn "ON" and conduct current between its source and drain (i.e. between terminal 114 to terminal 110) and pass the low voltage from node 108 to terminal 110 but with some amount of voltage drop (i.e., Vdrop) across the access MOSFET. Thus, if a source voltage is applied to terminal 114 while a high voltage is also applied to terminal 116, the source voltage is present at terminal 110. If the high voltage applied to terminal 112 is high enough to account for the Vdrop across the MOSFET, a sufficient high voltage can be realized across terminal 112 and terminal 110 that can cause the resistance of CNT 102 to oscillate, as described above. Accordingly, a write 1 operation can be achieved by removing the high voltage across CNT 102 after the high to low resistance transition time (i.e. create a low resistance, which corresponds to a "1" being stored on CNT 102) through CNT 102. A write 0 operation can be achieved by removing the high voltage across CNT 102 after the low to high resistance transition time (i.e. a create high resistance, which corresponds to a "0" being stored on CNT 102) though CNT 102. Removing the high voltage across CNT 102 can be achieved by removing the high voltage at terminal 116 to turn "OFF" the access MOSFET causing current to not flow between terminal 114 and terminal 110, or by altering the voltages of bitlines 108 or 109.

To read the value of memory cell 100 in operating mode 2, a high voltage can be applied at terminal 116 such that current flows through MOSFET 104 between terminal 114 and terminal 110, but a low voltage can be applied to bitline 109, such that the voltage drop from terminal 112 to terminal 110 is low, preventing the resistance of CNT 102 from changing. Bitline control circuitry 118 can measure the current flowing through CNT 102, and based on the measured current can determine the resistance state of CNT 102. Memory cell 100 can also be put into a standby mode by applying the source voltage to all of nodes, 112, 114, and 116. In the standby mode, little or no current flows through CNT 102, preventing the value of memory cell 100 stored on CNT 102 from changing.

The operating conditions of operating mode 2, can thus be summarized as follows:

|  | WL106 | BL108 | BL109 | Tpulse | Icnt | CNTresult |
|---|---|---|---|---|---|---|
| Write1: | $V_{high}$ | $V_{SS}$ | $V_{high}$ | $R_{high}$ to $R_{low}$ time | limit to $I_{low}$ | $R_{low}$ |
| Write0: | $V_{high}$ | $V_{SS}$ | $V_{high}$ | $R_{low}$ to $R_{high}$ time | allow $I_{high}$ | $R_{high}$ |
| Read: | $V_{high}$ | $V_{SS}$ | $V_{low}$ | NA | NA | $R_{unchanged}$ |
| Standby: | $V_{SS}$ | $V_{SS}$ | $V_{SS}$ | NA | NA | $R_{unchanged}$ |

Operating mode 1 and operating mode 2 described above are merely two common examples of operating modes that may be used with the techniques of this disclosure. It is contemplated that other operating modes may also be used.

Techniques of this disclosure include using a CNT device that comprises a plurality of separate CNT elements. As shown in FIG. 1A, for example, CNT 102 includes CNT 102A coupled in parallel to CNT 102B. Although the techniques described in this disclosure will generally be described with reference to a CNT device that includes two CNT elements, it is contemplated that more than two CNT elements may also be used.

When implemented into memory cells, CNT elements can temporarily get stuck in a high or a low resistance state. This undesirable condition is what is commonly referred to as a soft error, meaning the error is temporary as opposed to permanent. Permanent (i.e. hard) errors can be corrected with circuitry that does not add significant additional size or complexity to a memory device because the error is in a fixed location. A common technique is to replace these memory cells with spares in redundancy circuitry. Correcting soft errors often requires highly complex circuitry that can add a significant amount of size and access time to a memory device because the location is not fixed and every memory cell can exhibit soft error behavior. A common technique is to correct these memory cells with error correction circuitry. Techniques of this disclosure may, in some instances, reduce or eliminate the occurrences of these soft errors, and thus, improve overall memory performance.

CNT elements that are permanently or temporarily stuck in a high resistance state can prevent a successful write 1 operation and thus compromise write 1 yield, which refers to the percentage of write 1 operations that are successful. CNT elements that are permanently or temporarily stuck in a low resistance state can prevent a successful write 0 operation and thus compromise write 0 yield, which refers to the percentage of write 0 operations that are successful. Techniques of this disclosure can, in some instances, improve the overall yield of write operations for a memory device by improving the yield of write 1 and 0 operations. The write 1 and 0 behavior of a CNT configuration of 1 CNT for various stuck at $R_{high}$ and $R_{low}$ conditions is summarized in Table 1. Table 1 shows that a memory cell with a CNT configuration of 1 CNT has 0% tolerance to 1 stuck $R_{high}$ and 0% tolerance to 1 stuck $R_{low}$ conditions.

Table 1 shows a summary of net total resistance and data states resulting from a CNT configuration of one CNT and various combinations of stuck $R_{low}$ and $R_{high}$ conditions where R CNT=$R_{low}$=100 kilo-ohms=1E+5 ohms and R CNT=20 giga-ohms=2E+10 ohms.

TABLE 1

| Line # | Data State desired | R CNT 102A | R total | Data State actual | Memory Cell Operation |
|---|---|---|---|---|---|
| Write 1 & 0 states with all good CNT ||||||
| 1 | 1 | 1E+05 | 1.00000E+05 | 1 | Good |
| 2 | 0 | 2E+10 | 2.00000E+10 | 0 | |
| Write 1 & 0 states with 1 CNT stuck $R_{high}$ ||||||
| 3 | 1 | 2E+10 | 2.00000E+10 | 0 | Always Stuck 0 |
| 4 | 0 | 2E+10 | 2.00000E+10 | 0 | |
| Write 1 & 0 states with 1 CNT stuck $R_{low}$ ||||||
| 5 | 1 | 1E+05 | 1.00000E+05 | 1 | Always Stuck 1 |
| 6 | 0 | 1E+05 | 1.00000E+05 | 1 | |

R = low, Data = 1
R = high, Data = 0
Data = 1 when Rtotal < 1E+6
Data = 0 when Rtotal > 1E+8

Stuck at Tolerance Summary of Table 1

| Stuck at condition | Tolerance |
|---|---|
| 1 CNT stuck $R_{high}$ | 0% |
| 1 CNT stuck $R_{low}$ | 0% |

As described above, memory cell 100 can store a single bit of data (i.e. a "0" or "1"), with the storage state of memory cell 100 being a function of the resistance value of CNT 102. When CNT 102 includes CNT 102A and CNT 102B connected in parallel, the resistance value of CNT 102 is generally defined by the relationship: $(1/R_{102})=(1/R_{102A})+(1/R_{102B})$, where $R_{102}$ refers to the total resistance of CNT 102, $R_{102A}$ refers to the resistance of CNT 102A, and $R_{102B}$ refers to the resistance of CNT 102B. This disclosure will also use the shorthand notation $R_{102A} \| R_{102B}$ to refer to the total resistance of CNT 102, which is the combined resistance of CNT 102A in parallel with CNT 102B.

The resistance values of CNT 102A and CNT 102B can individually vary depending on the current and voltages applied across terminal 110 and terminal 112. Thus, the value of $R_{102A} \| R_{102B}$ also varies depending on the current and voltage applied across terminal 110 and terminal 112. By controlling the magnitude and duration (Tpulse) of a voltage and current applied to CNT 102A and CNT 102B, the resistance value of CNT 102 can be written, in the manner described above, to the low resistance value that corresponds to a digital "1" or to the high resistance value that corresponds to a digital "0" as desired.

If CNT 102A is in a low resistance state and CNT 102B is in a low resistance state, then the total resistance of CNT 102 is also low. Applying a high voltage difference across nodes 110 and 112 results in a high current flow through CNT 102A and CNT 102B. A high voltage with high current condition causes the resistance of CNT 102A and CNT 102B to increase. The increased resistance, however, lowers the current through CNT 102A and CNT 102B but the high voltage difference across nodes 110 and 112 is maintained A high voltage with low current condition causes their resistance to decrease, taking CNT 102A and CNT 102B back to a low resistance state. Once the resistance is low again, the current through CNT 102A and CNT 102B once again increases, causing the resistance of CNT 102A and 102B to once again increase. In this manner, the resistance of CNT 102A and CNT 102B, and hence the total resistance of CNT 102, oscillates between a high resistance state and a low resistance state when a high voltage difference is continuously applied across terminal 110 and terminal 112.

In the example described above, CNT 102A and CNT 102B generally change together, meaning typically both are in a high resistance state at the same time or both are in a low resistance state at the same time. In some instances, however CNT 102A and CNT 102B may not necessarily change from high resistance to low resistance simultaneously. For example, once one of CNT 102A or CNT 102B changes to a low resistance, the total resistance of CNT 102 may be low enough to where a write 1 operation can be successfully completed without waiting for the other CNT element to change to a low resistance. In such instances, the CNT element that does not change is not necessarily permanently stuck in a high resistance state, but despite being in high resistance state, the total resistance of CNT 102 changes to a low enough resistance value that a successful "write 1" is achieved based on one but not both of CNT 102A and CNT 102B changing to a low resistance state.

In other instances, however, one of CNT 102A or CNT 102B may be permanently stuck in a high resistance state, meaning the resistance of the stuck CNT is permanently high and not changing. In such instances when one (TNT element is permanently stuck in a high resistance state, the other CNT element can continue to change in the manner described above, thus causing the total resistance of CNT 102 to continue to change between high and low resistance states that can be recognized as successful "write 0" and "write 1" operations respectively.

Assume for example, that a high resistance state for CNT 102A is approximately 20 giga-ohms, while a low resistance state is approximately 100 kilo-ohms. Likewise, assume for CNT 102B that a high resistance state is approximately 20 giga-ohms, while a low resistance state is approximately 100 kilo-ohms. If both CNT 102A and CNT 102B are in a high resistance state, then the value of $R_{102A} \| R_{102B}$ will be approximately $((20*10^9)^{-1}+(20*10^9)^{-1})^{-1}$, which is equal to $10*10^9$. Thus, if the resistance of CNT 102A is 20 giga-ohms and the resistance of CNT 102B is 20 giga-ohms, then the total resistance of CNT 102 is 10 giga-ohms. In this example, 10 giga-ohms can be a high resistance corresponding to a logical 1.

If both CNT 102A and CNT 102B are in a low resistance state, then the value of $R_{102A} \| R_{102B}$ will be approximately $((100*10^3)^{-1}+(100*10^3)^{-1})^{-1}$, which is equal to $50*10^3$. Thus, if the resistance of CNT 102A is 100 kilo-ohms and the resistance of CNT 102B is 100 kilo-ohms, then the total resistance of CNT 102 is 50 kilo-ohms. In this example, 50 kilo-ohms can be a low resistance corresponding to a logical 0.

Assume now that CNT 102A is stuck in a high resistance state of 20 giga-ohms. If CNT 102B is also in a high resistance state, then the total resistance of CNT 102 will be approximately 10 giga-ohms as described earlier. If CNT 102B is in a low resistance state while CNT 102A is stuck in a high resistance state, then the value of $R_{102A} \| R_{102B}$ is approximately $((20*10^9)^{-1}+(100*10^3)^{-1})^{-1}$, which is approximately equal to 99.99995 kilo-ohms. While 90.99995 kilo-ohms is a higher resistance than the 50 kilo-ohm resistance that results from both CNT 102A and CNT 102B being in a low resistance state, 99.99995 kilo-ohms is still a much lower resistance than 10 giga-ohms, which results from both CNT 102A and CNT 102B being in a high resistance state. Accordingly, the value of $R_{102A} \| R_{102B}$ that results from CNT 102A being in a high resistance state and CNT 102B being in a low resistance state, or vice versa, can be treated as a low resistance that corresponds to a logical 1. Thus, when one of CNT 102A or 102B is stuck in a high resistance state, then write 1 and write 0 operations can still be performed by causing the resistance of the non-stuck CNT element to change. In this manner, even if one of CNT 102A or CNT 102B is stuck in a high resistance state, then the total resistance of CNT 102 still changes, enabling write 1 and write 0 operations to be successfully performed.

Table 2 below summarizes the various states of CNT 102A and CNT 102B described above. The Data State Desired column defines the desired data state. The R CNT 102A column describes the resistance state of CNT 102A. The R CNT 102B column describes the resistance state of CNT 102B. The Rtotal column describes the total resistance value of CNT 102 (i.e. $R_{102A} \| R_{102B}$) that results from the respective resistance states of CNT 102A and CNT 102B, and the Data State Actual column describes the corresponding memory cell data state based on the total resistance (i.e. logic 1 or logic 0). The Memory Cell Operation column defines operational result. The Stuck at tolerance summary defines the tolerance the CNT configuration has to the various stuck $R_{high}$ and $R_{low}$ conditions.

Table 2 shows a summary of net total resistance and data states resulting from a CNT configuration of two CNTs connected in parallel (e.g. CNT 102A and CNT 102B in FIG. 1A) and various combinations of stuck $R_{low}$ and $R_{high}$ conditions where R CNT=$R_{low}$=100 kilo-ohms=1E+5 ohms and R CNT=$R_{high}$=20 giga-ohms=2E+10 ohms.

TABLE 2

| Line # | Data State desired | R CNT 102A | R CNT 102B | R total | Data State actual | Memory Cell Operation |
|---|---|---|---|---|---|---|
| | Write 1 & 0 states with all good CNT | | | | | |
| 1 | 1 | 1E+05 | 1E+05 | 5.00000E+04 | 1 | Good |
| 2 | 0 | 2E+10 | 2E+10 | 1.00000E+10 | 0 | |
| | Write 1 & 0 states with 1 CNT stuck $R_{high}$ | | | | | |
| 3 | 1 | 1E+05 | 2E+10 | 9.99995E+04 | 1 | Good |
| 4 | 1 | 2E+10 | 1E+05 | 9.99995E+04 | 1 | |
| 5 | 0 | 2E+10 | 2E+10 | 1.00000E+10 | 0 | |
| | Write 1 & 0 states with 1 CAT stuck $R_{low}$ | | | | | |
| 6 | 1 | 1E+05 | 1E+05 | 5.00000E+04 | 1 | Always Stuck 1 |
| 7 | 0 | 1E+05 | 2E+10 | 9.99995E+04 | 1 | |
| 8 | 0 | 2E+10 | 1E+05 | 9.99995E+04 | 1 | |

R = low, Data = 1
R = high, Data = 0
Data = 1 when Rtotal <1E+6
Data = 0 when Rtotal >1E+8

Stuck at Tolerance Summary of Table 2

| Stuck at condition | Tolerance |
|---|---|
| 1 CNT stuck $R_{high}$ | 100% |
| 1 CNT stuck $R_{low}$ | 0% |

The third and fourth lines of Table 2 represent scenarios where either CNT 102A or CNT 102B is stuck in a high resistance state. In such instances, the value of $R_{102A} \| R_{102B}$ changes between $R_{LOW}$ and $R_{HIGH}/2$ instead of between $R_{LOW}/2$ and $R_{HIGH}/2$, but as described above, both $R_{LOW}$ and $R_{LOW}/2$ are still significantly lower resistances than $R_{HIGH}$ and can both be considered low resistances corresponding to a digital 1. Even though either CNT 102A or CNT 102B is stuck in a high resistance state the other CNT element can changed to a high resistance as shown in the fifth line of Table 2. Lines 6-8 of Table 2 represent scenarios where either CNT 102A or CNT 102B is stuck in a low resistance state. Table 2 shows that a memory cell with CNT configuration of two CNTs in parallel has 100% tolerance to 1 stuck $R_{high}$ and 0% tolerance to 1 stuck $R_{low}$ conditions. CNT 102 can also be defined to include CNT 102A and CNT 102B connected in series. The resulting stuck in a $R_{high}$ or $R_{low}$ state is shown in Table 3. Table 3 shows that a memory cell with CNT configuration of 2 CNTs in parallel has 0% tolerance to 1 stuck $R_{high}$ and 100% tolerance to 1 stuck $R_{low}$ conditions. In the example of Tables 2 and 3, it should be assumed that the resistance $R_{high}$ is much higher than the resistance $R_{low}$. In the example given above, for instance, $R_{high}(20*10^9)$ is a factor of $2*10^5$ higher than $R_{low}$ ($100*10^3$). This, however, is merely one example, and other values of $R_{high}$ and $R_{low}$ can be used with the techniques of this disclosure. Additionally, the factor by which $R_{high}$ exceeds $R_{low}$ is also merely one example, and other factors can be used with the techniques of this disclosure.

Figure 1B:
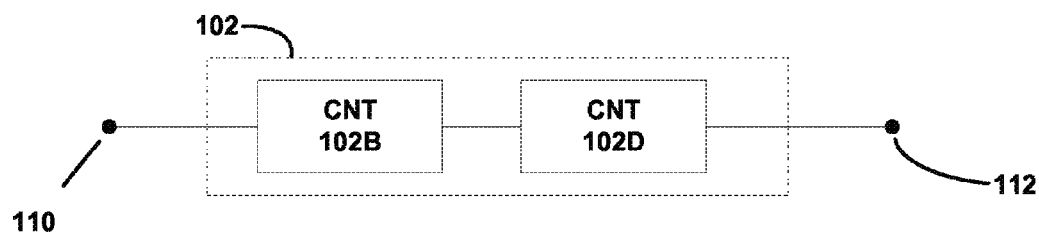
FIG. 1B shows a circuit diagram of an alternate CNT configuration technique for the carbon nanotube based memory cell shown in FIG. 1A.

FIG. 1B is a circuit diagram showing an alternate configuration of CNT 102 of FIG. 1A. In the alternate configuration, CNT 102 includes CNT element 102A and CNT element 102B in series, CNT 102 of FIG. 1B generally operates in the manner described above in relation to CNT 102 of FIG. 1A, and thus CNT 102 of FIG. 1B is generally interchangeable with CNT 102 of FIG. 1A. In this manner, the resistance value of CNT 102 of FIG. 1B is indicative of a digital "0" or a digital "1" and varies depending on the current and voltage applied across terminal 110 and terminal 112.

Table 3 shows a summary of net total resistance and data states resulting from a CNT configuration of two CNTs connected in series (e.g. FIG. 1B) and various combinations of stuck Rlow and Rhigh conditions where R CNT=$R_{low}$=100 kilo-ohms=1E+5 ohms and R CNT=$R_{high}$=20 giga-ohms=2E+10 ohms.

TABLE 3

| Line # | Data State desired | R CNT 102A | R CNT 102B | R total | Data State actual | Memory Cell Operation |
|---|---|---|---|---|---|---|
| | Write & 0 states with all good CNT | | | | | |
| 1 | 1 | 1E+05 | 1E+05 | 2.00000E+05 | 1 | Good |
| 2 | 0 | 2E+10 | 2E+10 | 4.00000E+10 | 0 | |
| | Write 1 & 0 states with 1 CNT stuck $R_{high}$ | | | | | |
| 3 | 1 | 1E+05 | 2E+10 | 2.00001E+10 | 0 | Always Stuck 0 |
| 4 | 1 | 2E+10 | 1E+05 | 2.00001E+10 | 0 | |
| 5 | 0 | 2E+10 | 2E+10 | 4.00000E+10 | 0 | |
| | Write 1 & 0 states with 1 CNT stuck $R_{low}$ | | | | | |
| 6 | 1 | 1E+05 | 1E+05 | 2.00000E+05 | 1 | Good |
| 7 | 0 | 1E+05 | 2E+10 | 2.00001E+10 | 0 | |
| 8 | 0 | 2E+10 | 1E+05 | 2.00001E+10 | 0 | |

R = low, Data = 1
R = high, Data = 0
Data = 1 when Rtotal <1E+6
Data = 0 when Rtotal >1E+8

Stuck at Tolerance Summary of Table 3

| Stuck at condition | Tolerance |
|---|---|
| 1 CNT stuck $R_{high}$ | 0% |
| 1 CNT stuck $R_{low}$ | 100% |

Generally it is random defects that create CNTs permanently or temporarily stuck in a high or low resistor value. Statistically they are distributed over the memory device with a low probability of occurrence which means it is not unusual to have a defect in many memory cells but it is extremely rare to have more than one defect in a memory cell. Thus, memory cells which can tolerate a single defect will have a higher yield and less need for redundancy and error correction circuitry. The yield benefit of having CNT 102A and CNT 102B in the configurations shown in FIG. 1A and FIG. 1B is shown in Tables 2 and 3 respectively. Table 2 shows that for the intended condition of write=1 data state, if either CNT 102A or 1029 is permanently or temporarily stuck in a high resistor value the write 1 will still be successful. However, for the intended condition of write=0 data state, if either CNT 102A or 102B is permanently or temporarily stuck in a low resistor value the write 0 will not be successful. The CNT 102A and 102B configuration shown in FIG. 1A provides tolerance to one of the CNT elements being permanently or temporarily stuck in a high resistor value but not stuck in a low resistor value. Table 3 shows that for the intended condition of write=0 data state, if either CNT 102A or 1029 is permanently or temporarily stuck in a low resistor value the write 0 will still be successful. However, for the intended condition of write=1 data state, if either CNT 102A or 102B is permanently or temporarily stuck in a high resistor value the write 1 will not be successful. The CNT 102A and 102B configuration shown in FIG. 1B provides tolerance to one of the CNT elements being permanently or temporarily stuck in a low resistor value but not stuck in a high resistor value.

Figure 1C:
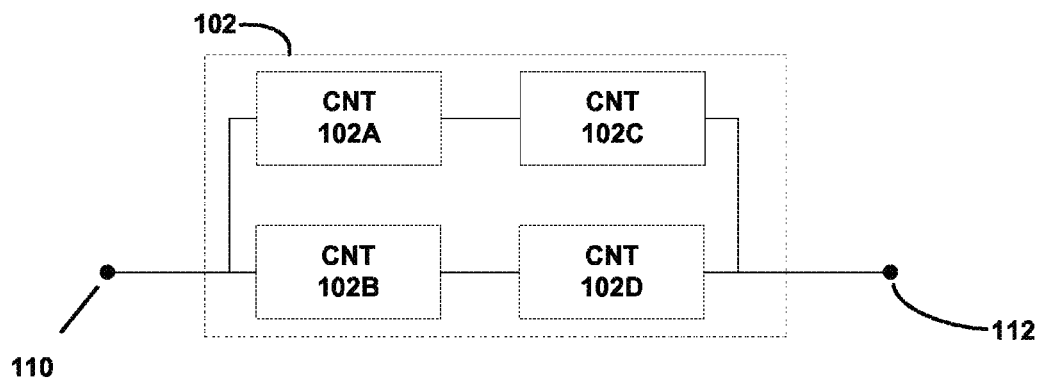
FIG. 1C shows a circuit diagram of an alternate CNT configuration technique for the carbon nanotube based memory cell shown in FIG. 1A.

FIG. 1C is a circuit diagram showing an alternate configuration of CNT 102 of FIG. 1A that results in a higher yield benefit than either FIG. 1A or FIG. 1B CNT alternate configurations. In the FIG. 1C alternate configuration, CNT 102 includes CNT element 102A, CNT element 1029, CNT element 102C, and CNT element 102D. CNT 102 of FIG. 1C generally operates in the manner described above in relation to CNT 102 of FIG. 1A, and thus CNT 102 of FIG. 1C is generally interchangeable with CNT 102 of FIG. 1A. In this manner, the resistance value of CNT 102 of FIG. 1C is indicative of a digital "0" or a digital "1" and varies depending on the current and voltage applied across terminal 110 and terminal 112. The resistance of CNT 102 of FIG. 1C is a function of the resistances of CNT elements 102A-102D.

In FIG. 1C, CNT 102A and CNT 102C are connected in series, while CNT 102B and CNT 102D are connected in series. When connected in series, the total resistance of the combination of CNT 102A and CNT 102C is the sum of the resistance of CNT 102A and CNT 102C. Similarly, the total resistance of the combination of CNT 1029 in series with CNT 102D is the sum of the resistance of CNT 102B and CNT 102D. The combination of CNT102A and CNT 102C is connected in parallel to the combination of CNT 102B and CNT 102D at terminal 110 and terminal 112. When none of CNT 102A-102D are stuck either high or low, then the total resistance of the combination of CNT 102A and CNT 102C and the total resistance of the combination of CNT 1029 and CNT 102D both oscillate in the manner described above relative to CNT 102 of FIG. 1A. The total resistance of CNT 102 thus also oscillates in the same manner described above.

If one of CNT 102A-102D is stuck high, then the combination that includes the stuck CNT is also stuck at a high resistance. For example, if CNT 102A is stuck high, then the total resistance of combination of CNT 102A and 102C will also be stuck high, regardless of whether or not CNT 102C continues to oscillate. In such instances, however, the alternate combination can continue to oscillate, as described above, thus causing the total resistance of CNT 102 to continue to oscillate.

If one of CNT 102A-102D is stuck low, then the combination that includes the stuck CNT can continue to oscillate. For example, if CNT 102A is stuck low, then CNT 102C can continue to oscillate. Using the example resistances above, if CNT 102A is stuck at a low resistance of 100 kilo-ohms and the resistance of CNT 102C oscillates between 100 kilo-ohms and 20 giga-ohms, then the total resistance of the combination of CNT 102A and CNT 102C will oscillate between approximately 200 kilo-ohms and 20 giga-ohms. Thus, even though CNT 102A is stuck low, the combination of CNT 102A and CNT 102C continues to oscillate between a high resistance value and a low resistance value, which enables the total resistance of CNT 102 to continue to oscillate. The behavior of FIG. 1B is summarized in Table 4. Table 4 shows that a memory cell with CNT configuration of a pair of 2 CNTs in series connected in parallel has 100% tolerance to 1 stuck $R_{high}$ and 100% tolerance to 1 stuck $R_{low}$ conditions and 50% tolerance to 2 stuck $R_{high}$ and 50% tolerance to 2 stuck $R_{low}$ conditions.

Table 4 shows a summary of net total resistance and data states resulting from a CNT configuration of a pair of two series connected CNTs connected in parallel (e.g. CNT 102A-D in FIG. 1C) and various combinations of stuck $R_{low}$ and $R_{high}$ conditions where R CNT=$R_{low}$=100 kilo-ohms=1E+5 ohms and R CNT=$R_{high}$=20 giga-ohms=2E+10 ohms.

TABLE 4

| Line # | Data State desired | R CNT 102A | R CNT 102B | R CNT 102C | R CNT 102D | R total | Data State actual | Memory Cell Operation |
|---|---|---|---|---|---|---|---|---|
| Write 1 & 0 states with all good CNT |
| 1 | 1 | 1E+05 | 1E+05 | 1E+05 | 1E+05 | 1.00000E+05 | 1 | Good |
| 2 | 0 | 2E+10 | 2E+10 | 2E+10 | 2E+10 | 2.00000E+10 | 0 | |
| Write 1 & 0 states with 1 CNT stuck $R_{high}$ |
| 3 | 1 | 1E+05 | 1E+05 | 1E+05 | 2E+10 | 1.99998E+05 | 1 | Good |
| 4 | 1 | 1E+05 | 1E+05 | 2E+10 | 1E+05 | 1.99998E+05 | 1 | |
| 5 | 1 | 1E+05 | 2E+10 | 1E+05 | 1E+05 | 1.99998E+05 | 1 | |
| 6 | 1 | 2E+10 | 1E+05 | 1E+05 | 1E+05 | 1.99998E+05 | 1 | |
| 7 | 0 | 2E+10 | 2E+10 | 2E+10 | 2E+10 | 2.00000E+10 | 0 | |
| Write 1 & 0 states with 1 CNT stuck $R_{low}$ |
| 8 | 1 | 1E+05 | 1E+05 | 1E+05 | 1E+05 | 1.00000E+05 | 1 | Good |
| 9 | 0 | 2E+10 | 2E+10 | 2E+10 | 1E+05 | 1.33334E+10 | 0 | |
| 10 | 0 | 2E+10 | 2E+10 | 1E+05 | 2E+10 | 1.33334E+10 | 0 | |
| 11 | 0 | 2E+10 | 1E+05 | 2E+10 | 2E+10 | 1.33334E+10 | 0 | |
| 12 | 0 | 1E+05 | 2E+10 | 2E+10 | 2E+10 | 1.33334E+10 | 0 | |
| Write 1 & 0 states with 2 CNT stuck $R_{high}$ |
| 13 | 1 | 1E+05 | 1E+05 | 2E+10 | 2E+10 | 1.00001E+10 | 0 | Good |
| 14 | 1 | 1E+05 | 2E+10 | 1E+05 | 1E+05 | 1.00001E+10 | 0 | for some |
| 15 | 1 | 2E+10 | 2E+10 | 1E+05 | 1E+05 | 1.00001E+10 | 0 | locations |
| 16 | 1 | 2E+10 | 1E+05 | 1E+05 | 2E+10 | 1.00001E+10 | 0 | of stuck |
| 17 | 1 | 1E+05 | 2E+10 | 1E+05 | 2E+10 | 1.99999E+05 | 1 | Rhigh |
| 18 | 1 | 2E+10 | 1E+05 | 2E+10 | 1E+05 | 1.99999E+05 | 1 | |
| 19 | 1 | 1E+05 | 2E+10 | 1E+05 | 2E+10 | 1.99999E+05 | 1 | |
| 20 | 1 | 2E+10 | 1E+05 | 2E+10 | 1E+05 | 1.99999E+05 | 1 | |
| 21 | 0 | 2E+10 | 2E+10 | 2E+10 | 2E+10 | 2.00000E+10 | 0 | |

TABLE 4-continued

| Line # | Data State desired | R CNT 102A | R CNT 102B | R CNT 102C | R CNT 102D | R total | Data State actual | Memory Cell Operation |
|---|---|---|---|---|---|---|---|---|
| \multicolumn{9}{c}{Write 1 & 0 states with 2 CNT stuck $R_{low}$} | | | | | | | | |
| 22 | 1 | 1E+05 | 1E+05 | 1E+05 | 1E+05 | 1.00000E+05 | 1 | Good |
| 23 | 0 | 2E+10 | 2E+10 | 1E+05 | 1E+05 | 1.00001E+10 | 0 | for some |
| 24 | 0 | 2E+10 | 1E+05 | 1E+05 | 2E+10 | 1.00001E+10 | 0 | locations |
| 25 | 0 | 1E+05 | 1E+05 | 2E+10 | 2E+10 | 1.00001E+10 | 0 | of stuck |
| 26 | 0 | 1E+05 | 2E+10 | 2E+10 | 1E+05 | 1.00001E+10 | 0 | Rlow |
| 27 | 0 | 2E+10 | 1E+05 | 2E+10 | 1E+05 | 1.99999E+05 | 1 | |
| 28 | 0 | 1E+05 | 2E+10 | 1E+05 | 2E+10 | 1.99999E+05 | 1 | |
| 29 | 0 | 2E+10 | 1E+05 | 2E+10 | 1E+05 | 1.99999E+05 | 1 | |
| 30 | 0 | 1E+05 | 2E+10 | 1E+05 | 2E+10 | 1.99999E+05 | 1 | |

R = low, Data = 1
R = high, Data = 0
Data = 1 when Rtotal <1E+6
Data = 0 when Rtotal >1E+8

Stuck at Tolerance Summary of Table 4

| Stuck at condition | Tolerance |
|---|---|
| 1 CNT stuck $R_{high}$ | 100% |
| 1 CNT stuck $R_{low}$ | 100% |
| 2 CNT stuck $R_{high}$ | 50% |
| 2 CNT stuck $R_{low}$ | 50% |

Figure 1D:
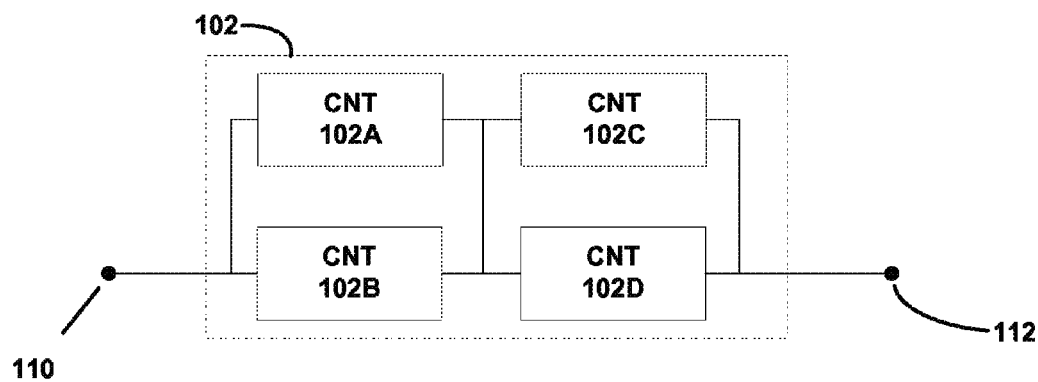
FIG. 1D shows a circuit diagram of an alternate CNT configuration technique for the carbon nanotube based memory cell shown in FIG. 1A.

FIG. 1D is a circuit diagram showing an alternate configuration of CNT 102 of FIG. 1A. In the alternate configuration, CNT 102 includes CNT element 102A, CNT element 102B, CNT element 102C, and CNT element 102D. CNT 102 of FIG. 1C generally operates in the manner described above in relation to CNT 102 of FIG. 1A, and thus CNT 102 of FIG. 1C is generally interchangeable with CNT 102 of FIG. 1A. In this manner, the resistance value of CNT 102 of FIG. 1C is indicative of a digital "0" or a digital "1" and varies depending on the current and voltage applied across terminal 110 and terminal 112. The resistance of CNT 102 of FIG. 1D is a function of the resistances of CNT elements 102A-102D. In FIG. 1D, CNT 102A and CNT 1029 are connected in parallel, while CNT 102C and CNT 102D are connected in parallel. The combination of CNT 102A and CNT 102B are connected in series to the combination of CNT 102C and CNT 102D.

Table 5 shows a summary of net total resistance and data states resulting from a CNT configuration of a pair of two parallel connected CNTs connected in series (e.g. FIG. 1D) and various combinations of stuck $R_{low}$ and $R_{high}$ conditions where R CNT=$R_{low}$=100 kilo-ohms=1E+5 ohms and R CNT=$R_{high}$=20 giga-ohms=2E+10 ohms.

TABLE 5

| Line # | Data State desired | R CNT 102A | R CNT 102B | R CNT 102C | R CNT 102D | R total | Data State actual | Memory Cell Operation |
|---|---|---|---|---|---|---|---|---|
| \multicolumn{9}{c}{Write 1 & 0 states with all good CNT} | | | | | | | | |
| 1 | 1 | 1E+05 | 1E+05 | 1E+05 | 1E+05 | 1E+05 | 1 | Good |
| 2 | 0 | 2E+10 | 2E+10 | 2E+10 | 2E+10 | 2E+10 | | |
| \multicolumn{9}{c}{Write 1 & 0 states with 1 CNT stuck $R_{high}$} | | | | | | | | |
| 3 | 1 | 1E+05 | 1E+05 | 1E+05 | 2E+10 | 1.50000E+05 | 1 | Good |
| 4 | 1 | 1E+05 | 1E+05 | 2E+10 | 1E+05 | 1.50000E+05 | 1 | |
| 5 | 1 | 1E+05 | 2E+10 | 1E+05 | 1E+05 | 1.50000E+05 | 1 | |
| 6 | 1 | 2E+10 | 1E+05 | 1E+05 | 1E+05 | 1.50000E+05 | 1 | |
| 7 | 0 | 2E+10 | 2E+10 | 2E+10 | 2E+10 | 2.00000E+10 | 0 | |
| \multicolumn{9}{c}{Write 1 & 0 states with 1 CNT stuck $R_{low}$} | | | | | | | | |
| 8 | 1 | 1E+05 | 1E+05 | 1E+05 | 1E+05 | 1.00000E+05 | 1 | Good |
| 9 | 0 | 2E+10 | 2E+10 | 2E+10 | 1E+05 | 1.00001E+10 | 0 | |
| 10 | 0 | 2E+10 | 2E+10 | 1E+05 | 2E+10 | 1.00001E+10 | 0 | |
| 11 | 0 | 2E+10 | 1E+05 | 2E+10 | 2E+10 | 1.00001E+10 | 0 | |
| 12 | 0 | 1E+05 | 2E+10 | 2E+10 | 2E+10 | 1.00001E+10 | 0 | |
| \multicolumn{9}{c}{Write 1 & 0 states with 2 CNT stuck $R_{high}$} | | | | | | | | |
| 13 | 1 | 1E+05 | 1E+05 | 2E+10 | 2E+10 | 1.00001E+10 | 0 | Good |
| 14 | 1 | 1E+05 | 2E+10 | 2E+10 | 1E+05 | 1.99999E+05 | 1 | for some |
| 15 | 1 | 2E+10 | 2E+10 | 1E+05 | 1E+05 | 1.00001E+10 | 0 | locations |
| 16 | 1 | 2E+10 | 1E+05 | 1E+05 | 2E+10 | 1.99999E+05 | 1 | of stuck |
| 17 | 1 | 1E+05 | 2E+10 | 1E+05 | 2E+10 | 1.99999E+05 | 1 | Rhigh |
| 18 | 1 | 2E+10 | 1E+05 | 2E+10 | 1E+05 | 1.99999E+05 | 1 | |
| 19 | 1 | 1E+05 | 2E+10 | 1E+05 | 2E+10 | 1.99999E+05 | 1 | |
| 20 | 1 | 2E+10 | 1E+05 | 2E+10 | 1E+05 | 1.99999E+05 | 1 | |
| 21 | 0 | 2E+10 | 2E+10 | 2E+10 | 2E+10 | 2.00000E+10 | 0 | |

TABLE 5-continued

| Line # | Data State desired | R CNT 102A | R CNT 102B | R CNT 102C | R CNT 102D | R total | Data State actual | Memory Cell Operation |
|---|---|---|---|---|---|---|---|---|
| Write 1 & 0 states with 2 CNT stuck $R_{low}$ | | | | | | | | |
| 22 | 1 | 1E+05 | 1E+05 | 1E+05 | 1E+05 | 1.00000E+05 | 1 | Good |
| 23 | 0 | 2E+10 | 2E+10 | 1E+05 | 1E+05 | 1.00001E+10 | 0 | for some |
| 24 | 0 | 2E+10 | 1E+05 | 1E+05 | 2E+10 | 1.99999E+05 | 1 | locations |
| 25 | 0 | 1E+05 | 1E+05 | 2E+10 | 2E+10 | 1.00001E+10 | 0 | of stuck |
| 26 | 0 | 1E+05 | 2E+10 | 2E+10 | 1E+05 | 1.99999E+05 | 1 | Rlow |
| 27 | 0 | 2E+10 | 1E+05 | 2E+10 | 1E+05 | 1.99999E+05 | 1 | |
| 28 | 0 | 1E+05 | 2E+10 | 1E+05 | 2E+10 | 1.99999E+05 | 1 | |
| 29 | 0 | 2E+10 | 1E+05 | 2E+10 | 1E+05 | 1.99999E+05 | 1 | |
| 30 | 0 | 1E+05 | 2E+10 | 1E+05 | 2E+10 | 1.99999E+05 | 1 | |

R = low, Data = 1
R = high, Data = 0
Data = 1 when Rtotal <1E+6
Data = 0 when Rtotal >1E+8

Stuck at Tolerance Summary of Table 5

| Stuck at condition | Tolerance |
|---|---|
| 1 CNT stuck $R_{high}$ | 100% |
| 1 CNT stuck $R_{low}$ | 100% |
| 2 CNT stuck $R_{high}$ | 75% |
| 2 CNT stuck $R_{low}$ | 25% |

Generally it is random defects that create CNTs permanently or temporarily stuck in a high or low resistor value. Statistically they are distributed over the memory device with a low probability of occurrence which means it is not unusual to have a detect in many memory cells but it is extremely rare to have more than one defect in a memory cell. Thus, memory cells which can tolerate a single defect will have a higher yield and less need for redundancy and error correction circuitry. The yield benefit of having CNT 102A, CNT 102B, CNT 102C and CNT 102D in the configurations shown in FIG. 1C and FIG. 1D is shown in Tables 4 and 5 respectively. Table 4 shows that for the intended condition of write=1 data state, if one of CNT 102A, CNT 102B, CNT 102C or CNT 102D is permanently or temporarily stuck in a high resistor value the write 1 will still be successful. Further, for the intended condition of write=0 data state, if one of CNT 102A, CNT 102B, CNT 102C or CNT 102D is permanently or temporarily stuck in a low resistor value the write 0 will still be successful. The CNT 102A, CNT 102B, CNT 102C and CNT 102D configuration shown in FIG. 1C provides 100% tolerance to one of the CNT elements being permanently or temporarily stuck in a high or low resistor value. Table 5 shows that for the intended condition of write=1 data state, if one of CNT 102A, CNT 1029, CNT 102C or CNT 102D is permanently or temporarily stuck in a high resistor value the write 1 will still be successful. Further, for the intended condition of write=0 data state, if one of CNT 102A, CNT 1029, CNT 102C or CNT 102D is permanently or temporarily stuck in a low resistor value the write 0 will still be successful. The CNT 102A, CNT 102B, CNT 102C and CNT 102D configuration shown in FIG. 1D provides 100% tolerance to one of the CNT elements being permanently or temporarily stuck in a high or low resistor value.

Figure 2:
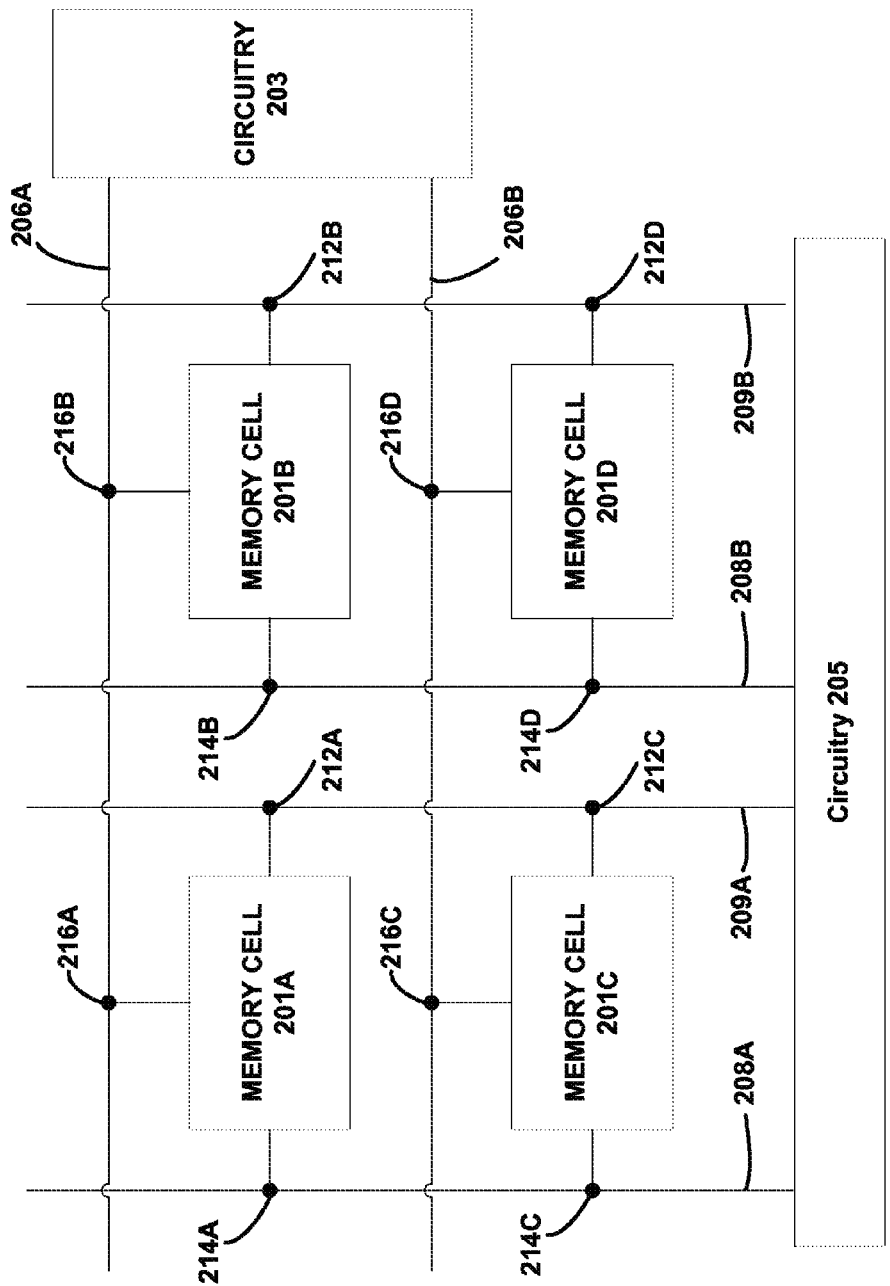
FIG. 2 shows a diagram of an array of CNT memory cells that may be used to implement the techniques of the present disclosure.

FIG. 2 shows a diagram of an array of memory cells 201A-201D. Memory cell 201A, memory cell 201B, memory cell 201C, and memory cell 201D may each have structure and function similar to memory cell 100 of FIG. 1A where CNT 102 can be any of the configurations shown in FIGS. 1A-1D. Decode circuitry 203 (circuitry 203) controls wordline 206A and wordline 206B. Wordline 206A connects to memory cell 201A at node 216A and connects to memory cell 201B at node 216B. Wordline 206B connects to memory cell 201C at node 216C and connects to memory cell 201D at node 216D. Although, not explicitly shown in FIG. 2, each of nodes 216A-216D may correspond to a gate of an access MOSFET as described in relation to access MOSFET 104 of memory cell 100 of FIG. 1A. If memory cells 201A-201D include n-channel access MOSFETs, then nodes 214A-D may each correspond to a source or drain terminal of an access MOSFET, with nodes 212A-212D each corresponding to a terminal of a CNT element.

FIG. 2 shows, for purposes of explanation, a 2-by-2 array of four memory cells, but an actual memory device may include an array of memory cells with tens of billions of individual memory cells or even more. Memory devices implementing one or more of the techniques described in this disclosure may be implemented in a wide array of electronic devices ranging from small portable devices such as music players, smartphones, game cartridges, and memory sticks up to larger devices such as tablet computers, gaming devices or consoles, desktop computers, super computers, and enterprise storage solutions.

Bitline 208A connects to memory cell 201A at node 214A and connects to memory cell 201C at node 214C. Bitline 208B connects to memory cell 201B at node 214B and connects to memory cell 201D at node 214D. Although, not explicitly shown in HG. 2, each of nodes 214A-D may correspond to a source or drain terminal of an access MOSFET as described in relation to access MOSFET 104 of memory cell 100 of FIG. 1A.

Bitline 209A connects to memory cell 201A at node 212A and connects to memory cell 201C at node 212C. Bitline 209B connects to memory cell 201B at node 212B and connects to memory cell 201D at node 212D. Although, not explicitly shown in FIG. 2, each of nodes 212A-212D may correspond to a terminal of a CNT element as described in relation to CNT 102 of memory cell 100 of FIG. 1A.

By controlling the voltages applied to wordline 206A, wordline 206B, bitline 208A, bitline 208B, bitline 209A, and bitline 209B, the CNT elements of individual memory cells can be addressed without altering the resistances of the CNT elements of other memory cells. For example, suppose that a write operation is being performed on memory cell 201A using operating mode 2 as described above. Circuitry 203 may apply a high voltage to wordline 206A, and bitline control circuitry (circuitry 205) may apply a high voltage to bitline 209A and a source voltage to bitline 208A. In this case, the high voltage applied to wordline 206A causes node 216A (connected to a gate of an access MOSFET, not shown in FIG. 2) to receive a high voltage. The high voltage applied to bitline 209A causes node 212A (connected to a terminal of a CNT element, not shown in FIG. 2) to receive a high voltage, and the source voltage applied to bitline 208A causes node 214A (connected to a source of an access MOSFET) to receive a source voltage. As described above with respect to operating mode 2 and FIG. 1A, the high voltage applied to node 216A causes current to flow through an access MOSFET, resulting in a high voltage drop across the CNT element of memory cell 201A. Thus, the resistance of the CNT element 201A can be changed. While this write operation is occurring at memory cell 201A, memory cells 201B, 201C, and 201D remain unchanged. Although the high voltage applied to wordline 206A can cause a high voltage at node 216B (connected to a gate of an access MOSFET in memory cell 201B), circuitry 205 may not apply a high voltage to either bitline 208B or 209B. In this case, with no high voltage drop across its CNT element, the state of memory cell 201B does not change.

Similarly, while this write operation is occurring at memory cell 201A, the high voltage applied to bitline 209A causes a high voltage at node 212C, and the source voltage applied to bitline 208A causes a source voltage at node 214C. Circuitry 203, however, does not apply a high voltage to wordline 206B. Thus, the access MOSFET of memory cell 201C does not conduct current, preventing the CNT element of memory cell 201C from having a high voltage drop across its terminals. Without a high voltage drop, the resistance of the CNT element does not oscillate, and the state of memory cell 201C does not change. Accordingly, by controlling the voltages applied to wordline 206A, wordline 20613, bitline 208A, bitline 208B, bitline 209A, and bitline 209B, in the manner described above, memory cells 201A, 201B, 201C, and 201D can be written to individually without altering the state of memory cells that are connected to a common wordline or common bitline.

In this manner memory cell 100 and memory cells 201A-201D are examples of memory cells that include multiple CNT elements in configurations shown in FIGS. 1A-1D.

Various embodiments of the invention have been described. These and other embodiments are within the scope of the following claims.

The invention claimed is:

1. A carbon nanotube based memory device comprising:
a plurality of memory cells, wherein at least one memory cell of the plurality of memory cells is configured to store a bit of data, the at least one memory cell of the plurality of memory cells comprising:
a first carbon nanotube (CNT) element;
a second CNT element connected in parallel to the first CNT element, wherein a first terminal of the first CNT element is connected to a first terminal of the second CNT element at a first node;
a third CNT element connected in series to the first CNT element; and
a fourth CNT element connected in series to the second CNT element, wherein a first terminal of the third CNT element is connected to a first terminal of the fourth CNT element at a second node; and
circuitry configured to:
determine a net total resistance value between the first node and the second node; and
based on the net total resistance value, determine a data state for the bit of data.

2. The carbon nanotube based memory device of claim 1, further comprising:
an access metal oxide semiconductor field effect transistor (MOSFET) configured to control a voltage at the first node;
a wordline connected to a gate of the access MOSFET; and
a bitline connected to the second node.

3. The carbon nanotube based memory device of claim 1, wherein the first CNT element has a first resistance and the second CNT element has a second resistance, wherein the first resistance changes between a first high resistance and a first low resistance upon application of a first controlled voltage and first current across the first CNT element and the second resistance changes between a second high resistance and a second low resistance upon application of a second controlled voltage and second current across the second CNT element.

4. The carbon nanotube based memory device of claim 3, wherein the net total resistance between the first node and the second node changes between a third low resistance and a third high resistance when either the first or second CNT element is in a stuck state.

5. The carbon nanotube based memory device of claim 4, wherein the third low resistance is approximately equal to the second low resistance.

6. The carbon nanotube based memory device of claim 3, wherein the net total resistance varies as the first resistance and the second resistance vary.

7. The carbon nanotube based memory device of claim 3, wherein the second CNT element is configured to change between the second high resistance and the second low resistance when the first CNT element is in a stuck state.

8. The carbon nanotube based memory device of claim 7, wherein the first CNT element is configured to change between the first high resistance and the first low resistance when the second CNT element is in a stuck state.

9. The carbon nanotube based memory device of claim 1, wherein a second terminal of the first CNT element is connected to a second terminal of the second CNT element at a third node, and wherein a second terminal of the third CNT element is connected to a second terminal of the fourth CNT element at the third node.

* * * * *